United States Patent [19]

Babakanian et al.

[11] Patent Number: 5,299,136
[45] Date of Patent: Mar. 29, 1994

[54] FULLY TESTABLE DCVS CIRCUITS WITH SINGLE-TRACK GLOBAL WIRING

[75] Inventors: Jacquelin Babakanian, Boca Raton; James W. Davis, Delray Beach; Mark S. Garvin, Boca Raton; Robert M. Swanson, Boca Raton; Nandor G. Thoma, Boca Raton; David M. Wu, Boca Raton, all of Fla.

[73] Assignee: International Business Machines Corp., Armonk, N.Y.

[21] Appl. No.: 711,466

[22] Filed: Jun. 5, 1991

[51] Int. Cl.$^5$ .................................. G06F 15/20
[52] U.S. Cl. .................................. 364/488; 371/22.3; 371/22.5
[58] Field of Search ............... 364/488; 371/22.3, 22.5

[56] References Cited

U.S. PATENT DOCUMENTS

| | | | |
|---|---|---|---|
| 4,535,467 | 8/1985 | Davis et al. | 377/81 |
| 4,570,084 | 2/1986 | Griffin et al. | 307/452 |
| 4,608,649 | 8/1986 | Davis et al. | 364/491 |
| 4,656,417 | 4/1987 | Kirkpatrick et al. | 324/73 |
| 4,686,392 | 8/1987 | Lo | 307/445 |
| 4,698,830 | 10/1987 | Barzilai et al. | 377/19 |
| 4,727,313 | 2/1988 | Barzilai et al. | 324/73 |
| 4,742,471 | 5/1988 | Yoffa et al. | 364/300 |
| 4,942,316 | 7/1990 | Béranger et al. | 307/455 |
| 5,075,574 | 12/1991 | Boudon | 307/455 |

OTHER PUBLICATIONS

E. Eichelberger, "A Logic Design Structure for LSI Testability", The Proceedings of the 14th Design Automation Conference (IEEE), 1977, pp. 206–215.
T. W. Williams et al., "Design for Testability-A Survey", IEEE Trans. on Computers, vol. C-31, No. 1, Jan 1982, pp. 1–15.
S. K. Jain et al., "Test Generation for MOS Circuits Using D-Algorithm", The Proceedings of the 20th Design Automation Conference (IEEE), 1983, pp. 298–304.
H. Fujiwara et al., "On the Acceleration of Test Generation Algorithms", Trans. on Computers, vol. C-32, No. 12, Dec. 1983, pp. 1137–1144.
J. B. Hickson et al., "Testing Scheme for Differential Cascode Voltage Switch Circuits", IBM Technical
(List continued on next page.)

Primary Examiner—Edward R. Cosimano
Attorney, Agent, or Firm—Romualdas Strimaitis; John C. Smith

[57] ABSTRACT

Groups of DCVS (Differential Cascode Voltage Switch) circuits are interconnected by single-track data transfer connections. Each group contains one or more DCVS tree circuits, through which data signals propagate only on dual-track connections. In each group, at least one DCVS tree circuit is configured as an input boundary tree, and at least one tree circuit is configured as an output boundary tree. All data inputs externally applied to a group, are transferred only through input boundary trees of the group, and all data outputs transferred out of a group leave the group only through output boundary trees of the group. If a group has only a single tree, that tree serves as input and output boundary tree of the group. Each input boundary tree of each group has one or more associated primary shift register latch (SRL) circuits through which all external data inputs to that tree are transferred. Such external data inputs are received through the single-track connections mentioned above. The primary SRL circuits are also used to present predeterminable test data inputs to respective trees, and to collect primary test data outputs representing signals received through the single-track connections. In such usage, the SRL circuits are connected as a scannable shift register. Each output boundary tree has an exclusive-OR (XOR) circuit for indicating if the respective tree is in a legal or illegal state. The XOR circuits connect to secondary scannable SRL circuits for external presentation of illegal state indication. The primary test data outputs together with the externally presented illegal state indications form a basis for detecting and locating any faulty state in any group.

13 Claims, 7 Drawing Sheets

OTHER PUBLICATIONS

Disclosure Bulletin, vol. 27, No. 10B, Mar. 1985, pp. 6148–6152.

R. Wei et al., "New Front-End and Line Justification Algorithm for Automatic Test Generation", 1986 International Test Conference (IEEE), 1986, pp. 121–128.

M. H. Schultz et al., "SOCRATES: A Highly Efficient Automatic Test Pattern Generation System", 1987 International Test Conference (IEEE), 1987, pp. 1016–1026.

N. K. Jha, "Testing for Multiple Faults in Domino-CMOS Logic Circuits", IEEE Trans. on Computer-Aided Design, vol. 7, No. 1, Jan. 1988, pp. 109–116.

J. D. Calhoun et al., "A Framework and Method for Hierarchial Test Generation", 1989 International Test Conference (IEEE), 1989, pp. 480–490.

FULLY TESTABLE DCVS CIRCUITS WITH SINGLE-TRACK GLOBAL WIRING

FIELD OF THE INVENTION

This invention relates to differential cascode voltage switch (DCVS) circuits, and particularly to arrangements permitting efficient layout and accurate testing of such circuits.

BACKGROUND OF THE INVENTION

DCVS (Differential Cascode Voltage Switch) circuits, developed for VLSI applications, are capable of providing high functional density and performance. Such circuits comprise "tree" clusters of active device pairs which operate as discrete logic circuits. Each tree receives complementary input signals on pairs of conductors, and produces an output signal having a predetermined logical relation to the input signals. The output signal, presented on a pair of conductors, is in a "legal" state only if the signals on the respective conductors are at different levels, and in an "illegal" state otherwise.

Presently, the paired conductors on which input and output signals are conveyed relative to trees are termed "2-track" or "dual-track" connections". Dual-track connections consume more chip space and are more difficult to route through a chip than single-track (single wire) connections. However, single-track connections have not been considered feasible because they permit propagation of faulty signals between trees with essentially indeterminate effects.

It is also desirable to be able to test integrated logic circuits on a chip, including DCVS tree circuits. A simple presently well known testing technique involves arranging circuits to be tested in "level sensitive scan design" (LSSD) groups, and providing "scannable shift register latch" (SRL) circuits integral with each group. Test signals scanned into the SRL latches are applied to respective groups, the groups are operated for a clock cycle during which signals representing states of groups are scanned into SRL circuits (usually of other groups), and the signals then stored in the SRL circuits are scanned out for evaluation (fault detection and location) either off chip or on chip. The LSSD grouping is supposed to ensure that any fault conditions in a group can be detected and traced by one or more scan in/scan out operations.

Arrangements of this kind and their rationale are presented in "A Logic Design Structure For LSI Testability", E. B. Eichelberger et al, Proceedings of the 14th Design Automation Conference (1977), IEEE, pages 206–215 (hereafter referred to as the "Eichelberger paper").

It has been proposed also to use scannable shift register latches to facilitate testing of DCVS circuits. Refer, for instance, to U.S. Pat. Nos. 4,698,830 and 4,656,417, and IBM Technical Disclosure Bulletin, Vol. 27, No. 10B, pages 6148–6152, J. B. Hickson et al, "Testing Scheme For Differential Cascode Voltage Switch Circuits. However, these proposals have a number of shortcomings in that their implementations would require departure from existing (and proven) LSSD design practices, and not alleviate the previously stated use of 2-track connections between DCVS circuit groups.

Accordingly, the aim of this invention is to provide an arrangement of DCVS circuits which allows for routing of signals between DCVS circuits over single-track connections (hereafter also termed single-track global interconnect wiring), while permitting complete and accurate testing such that all faults including illegal output states of DCVS tree circuits are detectable and traceable.

OBJECTS OF THE INVENTION

An object of the present invention is to provide an arrangement of DCVS circuits in which signals are conveyed between DCVS tree circuits, or groups of circuits, on single-track connections while the circuits are so configured that all faults, including illegal states of DCVS tree circuits, are fully detectable and traceable (to a circuit at fault).

Another object is to provide an arrangement of DCVS circuits in which signals are conveyed between DCVS tree circuits through single-track connections, and in which signals representing test data can be applied to and collected from such circuits in a manner permitting accurate detection and location of faults.

Another object is to provide an arrangement of DCVS circuits which is configurable in accordance with existing LSSD design practices, which can be efficiently integrated with scannable shift register (SRL) latches for testability, which allows for signals to be transferred between DCVS circuits via single-track connections, and which allows for accurate detection and location of all faults including illegal output states of individual DCVS trees.

SUMMARY OF THE INVENTION

In accordance with the invention, SRL latch circuits for LSSD logic testing are integrated with groups of DCVS tree circuits (logic groups) so that test signals are scannable into each group and signals representing resulting group states after a cycle of operation are scannable out of each group. Each group comprises one or more DCVS trees. The SRL circuits are interconnected globally so that signals can be scanned into all groups from a single source (either a single pin on the chip or a single bit output of one on-chip source device), and so that all group states can be scanned out to one evaluating circuit or device (either through one or more pins on the chip or through one or more input connections to an on-chip device). Furthermore, signal connections between groups are carried on single-track connections between tree outputs of groups and inputs of SRL circuits in other groups.

Groups are operated in "normal" and "test" modes. In normal mode, each group receives inputs representing logical arguments, from other groups (or off-chip) sources via single-track connections to respective SRL circuits, and produces output signals which are forwarded to other groups (on the same chip or other chips) via single-track connections to SRL circuits of the other groups. In test mode, test data is scanned serially into the SRL circuits of all groups, groups are operated for one or more clock cycles, and signals representing resulting group states are scanned serially out of the SRL circuits of all groups.

Since illegal states of DCVS trees are not always detectable by the test mode operations, the groups are augmented by exclusive-OR circuits for positively detecting such illegal states. The exclusive-OR circuits receive dual-track outputs of DCVS tree circuits and produce an illegal indication when respective tree outputs are at equal (or almost equal) voltage levels. When the tree outputs are at unequal levels, the exclusive-OR circuits produce outputs representing legal indications.

In preferred embodiments, the exclusive-OR circuits are connected to secondary SRL latch circuits so that their legal/illegal state indications can be scanned out efficiently (e.g., for evaluation with test signals scanned out from the primary SRL circuits through which test signals are applied to the groups). In several of these embodiments, each exclusive-OR circuit is connected to an associated SRL circuit to form a circuit combination presently called an exclusive-OR scannable circuit array (XSCA) unit. The secondary SRL circuits in the XSCA units and the primary SRL circuits for test inputs may be scanned out in coordination for test analysis.

DETAILED DESCRIPTION OF THE INVENTION

Figure 1:
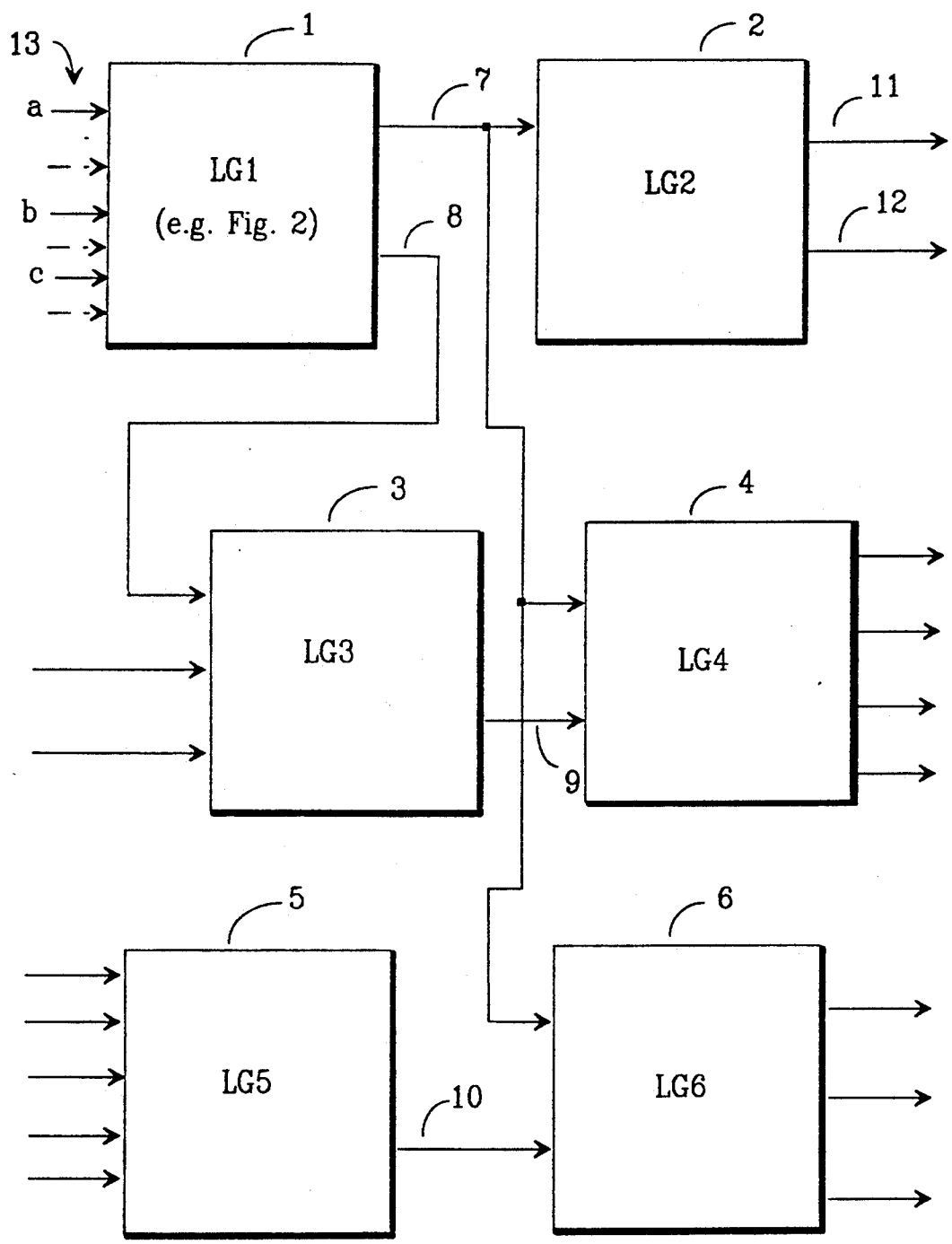
FIG. 1 schematically illustrates blocks representing groups of DCVS tree circuits, configured with single-track interconnections in accordance with the present invention.

Referring to FIG. 1, six groups of logic circuits are shown at 1-6. The groups are also denoted Logic Groups 1-6 (LG1-LG6). Multiple such groups may be contained on a single LSI semiconductor chip. Elements of typical group LG1 are illustrated in FIG. 2 and discussed below.

In accordance with the present invention, signals transferred between such logic groups are conveyed over single-track (single conductor) connections suggested at 7-12. As shown later, each group may contain multiple DCVS trees and other circuits. Within each group, signals are conveyed between trees and other circuits over dual-track (2 wire) connections. Multiple inputs to LG 1 are indicated specifically at 13. For reasons which will be apparent as the description of FIG. 2 unfolds, three of these inputs are shown by solid lines preceded by symbols a, b and c, while other inputs to the same group are suggested by broken lines.

Figure 2:
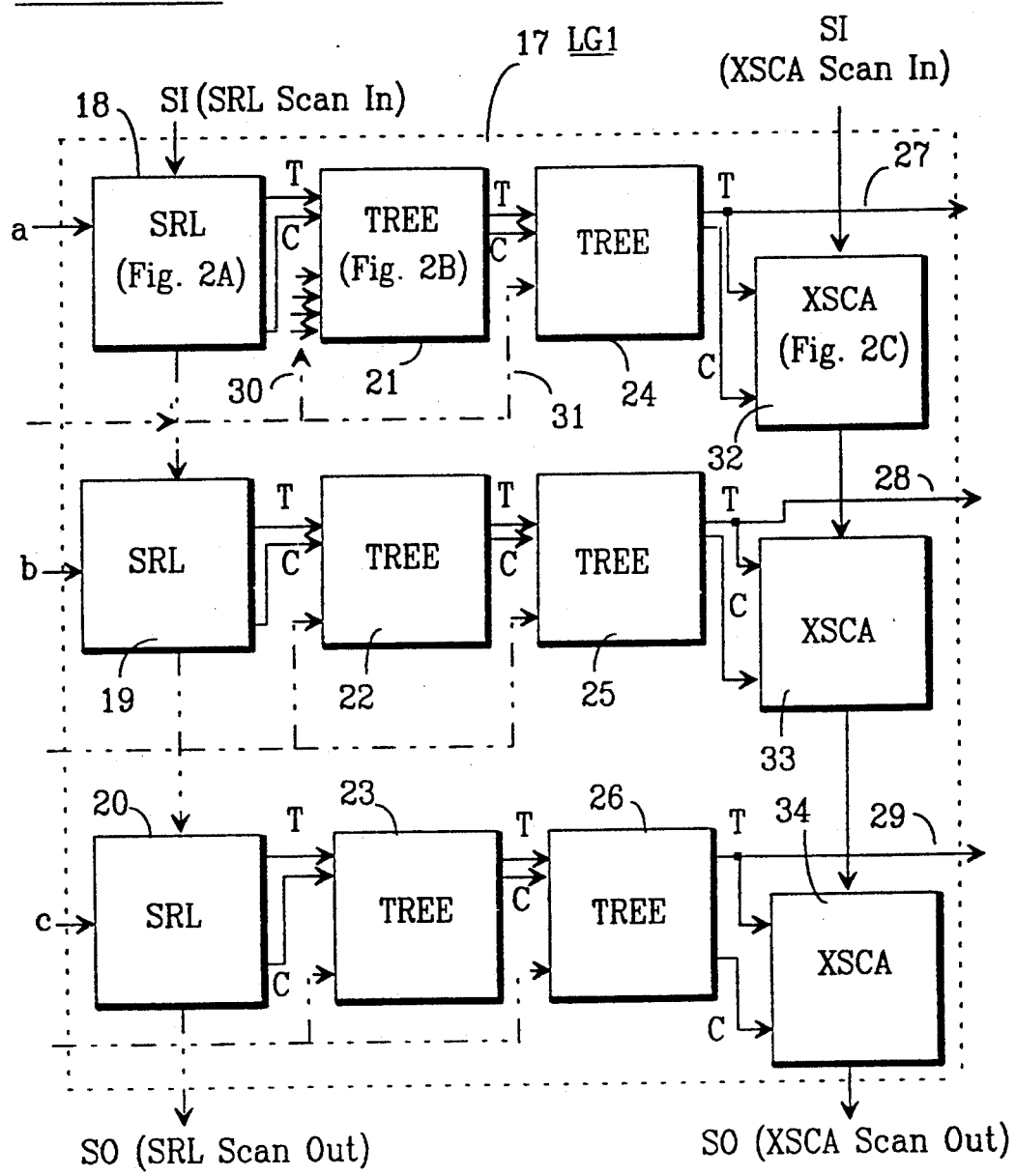
FIG. 2 schematically illustrates a typical circuit block of FIG. 1, configured for full testability in accordance with the invention, with SRL (scannable shift register latch) circuits, DCVS tree circuits, and XSCA (exclusive-OR scannable circuit array) circuits.

Referring to FIG. 2, typical logic group LG1, shown at 17, comprises shift register latch (SRL) circuits 18-20 in which (single-track) group inputs (a, b, c, . . . ) are buffered, DCVS tree circuits 21-23 having dual-track connections to outputs of the SRL circuits, and other DCVS tree circuits 24-26 at which respective group outputs 27-29 are formed. DCVS trees such as 21-23, which receive buffered group inputs directly from SRL circuits, are referred to hereafter as "input boundary trees". DCVS trees such as 24-26, from which group output signals are transferred, are referred to hereafter as output boundary trees. Although not shown in this Figure, a group may have intermediate trees which are neither at input nor output boundaries of the group.

During normal mode system operations (normal and test mode system operations are defined later), Tree 21 receives a 2-track input from SRL 18, which corresponds to true and complement forms of the group input signal "a", and other 2-track inputs suggested symbolically at 30, and produces a 2-track output signal having a particular logical relation to its input. True (T) and complement (C) outputs of tree 21 are applied as a dual-track input to tree 24, along with other inputs to the latter tree suggested symbolically at 31. Tree 24 produces true and complement outputs also designated T and C respectively.

As suggested at 30 and 31, each tree may have plural two-track inputs, but each tree has only a single two-track output. The additional two-track inputs suggested at 30 and 31 originate either externally, and are conveyed through other SRL circuits (not shown), or they originate at outputs of trees within the group and are conveyed directly (without intervening SRL's).

True phase outputs T of the output boundary trees 24-26, are presented at 27-29 for single-track connection to other groups (on the same chip or other chips). Full 2-track outputs of output boundary tree 24-26 are coupled as inputs to test circuits 32-34, each of the latter designated as an "exclusive-OR scanning circuit arrray" (XSCA).

Each logic group such as LG1 is operated in two modes; a normal mode and a test mode. In normal mode, data signals such as a, b, c, . . . (from other groups or other chips) are transferred over single-track connections to SRL circuits such as 18-20 in parallel. SRL circuits within each group, and between groups, are interconnected as a serial bit shifting array, and in test mode test bits are shifted serially into the SRL circuits (typically from a source external to the chip), clocked in parallel from the SRL's to respective input boundary trees, and resulting signals received in the SRL's from their single-track inter-group input data connections are shifted out of the SRL's (typically to a test evaluating system or circuit external to the chip).

For test mode operations, SRL circuits such as 18-20 in each group are connected as a "scannable" test bit shifting array, with the first circuit 18 having a scan-in input SI, and the last circuit 20 having a scan-out output SO. Furthermore, SRL circuits in all groups on a chip are interconnected "globally" as a bit shifting array, with the SO output of each group other than a "last" group connecting to an SI input of a following group, and the SI input of each group other than a first group connecting to the SO output of a preceding group. The SI input of the first group and SO output of the last group connect to respective pins on the chip, and through those pins to test circuits or systems external to the chip.

In test mode, all SRL circuits on a chip are initialized to a predetermined test state by a "scan in" operation, in which test bits are shifted into the SRL's (from a source external to the chip thru a single SI input pin on the chip). Upon completion of the scan in function, the test signals stored in the SRL's are clocked in parallel into respective input boundary trees such as 21–23, to establish a desired initial test state in those tree circuits. The resulting interaction between the trees in the group causes logically related output signals to appear at output boundary trees. The latter signals are latched into SRL circuits of the same or other groups (through single-track connections between the output boundary tree circuits and SRL circuits in the other groups). These states of the SRL's, representing conditions received through their single-track inter-group data input connections, are examined as test indications by means of a "scan out" process in which states instantly stored in all SRL's are shifted serially out to an examining circuit or system through one or more SO pins on the chip.

XSCA circuits such as 32–34 are also interconnected as a scannable array, and used as auxiliary test circuits for detecting illegal states of a group. Recall that illegal states occur when outputs of a DCVS tree are at equal levels. As explained later, test data scanned out of SRL circuits such as 18–20 is useful only for detecting faults other than illegal tree states, and data scanned out of the XSCA circuits is needed for detecting and tracing illegal states.

Each XSCA circuit contains an exclusive-OR circuit which determines if the 2-track input to the respective circuit represents a legal or illegal state. If the XSCA input is legal the signals on the two input tracks are at different voltage levels, and the output of the exclusive-OR circuit is at a first voltage level associated with that condition. However, if the inputs to the exclusive-OR circuit are illegal, they are at the same (or about the same) voltage level, and the output of that circuit goes to a second voltage level different from the first level thereby distinguishing the illegal condition.

Figure 2A:
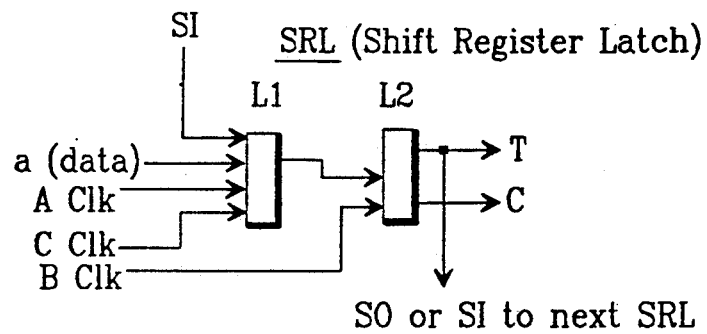
FIG. 2A illustrates a typical SRL circuit in the block schematic of FIG. 2.
Figure 2B:
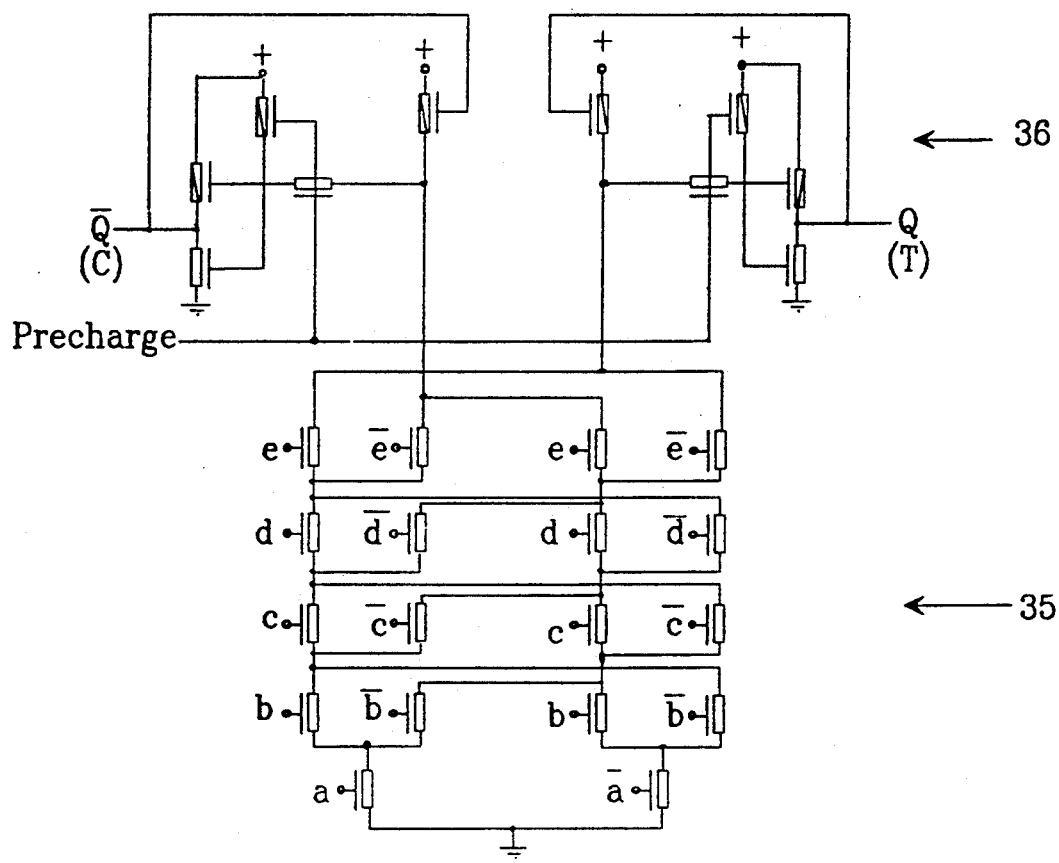
FIG. 2B illustrates a representative DCVS tree circuit in the block of FIG. 2.
Figure 2C:
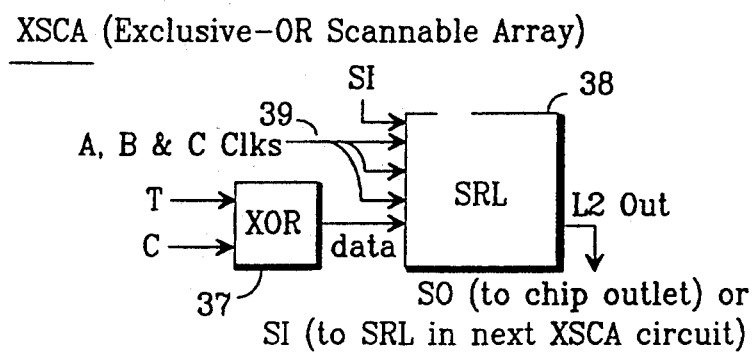
FIG. 2C illustrates a typical XSCA circuit in the block arrangement of FIG. 2 for detecting illegal states in associated tree circuits in the block.

An SRL circuit is shown schematically in FIG. 2A, a typical DCVS tree circuit is shown schematically in FIG. 2B, and a typical XSCA circuit is shown schematically in FIG. 2C. These circuits and their operations are described next.

The SRL circuit shown schematically in FIG. 2A, and its use in LSSD circuit testing operations in general, are fully described in the previously cited Eichelberger paper. The circuit shown in FIG. 2A is representative of all presently considered SRL's, but its inputs correspond specifically to those associated with SRL 18 of FIG. 2.

Each SRL comprises a pair of latch circuits L1 and L2. Latch circuit L1 has a normal data input "a" connected to the respective single-track data connection (the path of signal "a" in respect to SRL 18 of FIG. 2), and a test data input SI connected to the SI test bit source of the respective SRL (see FIG. 2). Latch circuit L1 has a normal mode clock signal input "C" and a test mode clock signal input "A". Latch L2 has a data input connected to the output of L1, a clock signal input "B", and a 2-track output T, C at which signals appear that represent respective true and complement phases of a signal stored in that latch.

In normal mode operations clock signal C is activated to transfer data from single track input "a" into L1. At the same time, clock signal B is activated so that the signal latched into L1 flows instantly into L2 and is simultaneously latched there. The signal held in L2 is applied subsequently as a logical input argument to the respective input boundary tree, during a "validation" operation conducted relative to all DCVS trees as described below with respect to FIG. 2B, and the latter operations determine tree and logic group outputs which are subsequently latched into SRL's by a next clock signal C.

In test mode operations, clock signal A is activated to shift a test bit into L1 from the SI input of that latch (which is connected either to an SI input pin of the chip or an L2 output of another SRL circuit as explained previously). Thereafter, clock signal B is activated to shift data from L1 into L2. If the SRL is other than the last element in the associated scannable array, the true output T of L2 is coupled to the SI input of a latch L1 in a next SRL. If the SRL is the last scannable element of a logic group or chip, the True output of L2 appears at the SO output of the respective group or chip.

The exemplary DCVS tree circuit shown in FIG. 2B represents the DCVS equivalent of a 5 way exclusive OR logic circuit. A similar circuit is shown in a paper by Hickson et al "Testing Scheme For Differential Cascode Voltage Switch Circuits", published in the IBM Technical Disclosure Bulletin, Vol. 27 No. 10B, March 1985 (pages 6148–6152). That paper also describes an arrangement for testing DCVS tree circuits using SRL circuits; but without the present features of providing single-track connections between groups of DCVS tree circuits with full testability for detection and location of all faults including illegal states.

As shown in FIG. 2B, a DCVS tree circuit comprises a logical transfer section indicated generally at 35 and a load circuit section indicated generally at 36. Logical transfer section 35 receives multiple two track inputs, illustrated presently as true and complement phases of signals a, b, . . , e. Load circuit 36 produces the two track result output of the tree, illustrated presently as true and complement phases of signal Q.

As is presently well known in the art, DCVS tree circuits such as that shown in FIG. 2B are operated cyclically in precharge and validation phases. Charges developed between the logic transfer and load circuit sections, during precharge, discharge through the transistors in the load section and some of the transistors in the logic transfer section; the circuit paths through the latter section being established as a function of states of respective inputs a–e. In the particular circuit illustrated, output Q is active/high after validation if and only if true phases of inputs a–e are all coincidentally active/high.

Referring to FIG. 2C, typical XSCA circuit 32 (of FIG. 2) comprises an exclusive-OR circuit 37 and an SRL circuit 38. SRL 38 has a data input SI, for input of data stored in another secondary SRL, a normal data input coupled to the output of exclusive-OR 37, and 3 clock signal inputs (for clocks A, B and C) indicated collectively at 39. SRL circuits such as 38 are presently termed "secondary SRL circuits" to distinguish them from the "primary SRL circuits" shown at 18-20 in FIG. 2.

The secondary and primary SRL circuits are similar in form, but the secondary SRL circuits are connected only for scan out and do not have a scan in mode comparable to that of the primary SRL circuits. During operations of logic groups LG (FIGS. 1, 2), exclusive-OR circuits 37 are activated by C clock signals to transfer legal or illegal state indications, and simultaneously, secondary SRL circuits such as 38 are activated by B clock signals to store state signals transferred by respective exclusive-OR circuits 37. Accordingly, when so activated, a secondary SRL circuit will store an illegal state indication if and only if both inputs to the associated exclusive-OR circuit 37 are at the same level (and otherwise a legal state indication is stored).

Faults detectable by scan out of the primary SRL circuits such as 18-20 (FIG. 2) are presently termed class 1 faults, and faults detectable by scan out of secondary SRL circuits are termed class 2 faults. Class 2 faults are associated only with detectable illegal states and class 1 faults are all faults other than detectable illegal states (including faults due to malfunctions in primary SRL's, faults caused by multiple stuck conditions in trees or other malfunctions in trees). That all class 1 faults are detectable and traceable (as to origin) may be appreciated by considering that states scanned into the primary SRL circuits in test mode are both predetermined and can be chosen by design to evoke scan out indications of class 1 faults that are detectable and traceable (to specific primary SRL or tree circuits).

In conjunction (or association) with the scan out of test data from primary SRL's, secondary SRL's may be scanned out. If directed to an off-chip evaluating circuit, data of a secondary scan out can be transferred either through the same SO pin as data of the related primary scan out or through a separate pin. By its position in the secondary scan out sequence, a bit representing an illegal state indication may be correlated to an illegal state (class 2) fault in either an output boundary tree coupled to a specific XSCA circuit or in the set of trees which affect inputs of that circuit. Any other fault—i.e., class 1 fault—is detectable through evaluation of data produced in (one or more) primary scan outs. Thus, by conjointly evaluating data recovered from both primary and secondary scan outs, the source of any fault indication can be traced to a specific tree or SRL circuit within a specific logic group.

Variations of the XSCA circuit configuration just described relative to FIGS. 2 and 2C, are discussed next with reference to FIGS. 3-5. In these figures, the primary SRL's are not shown for clarity, but it should be understood that they are present in essentially the same positions as shown in FIG. 2.

Figure 3:
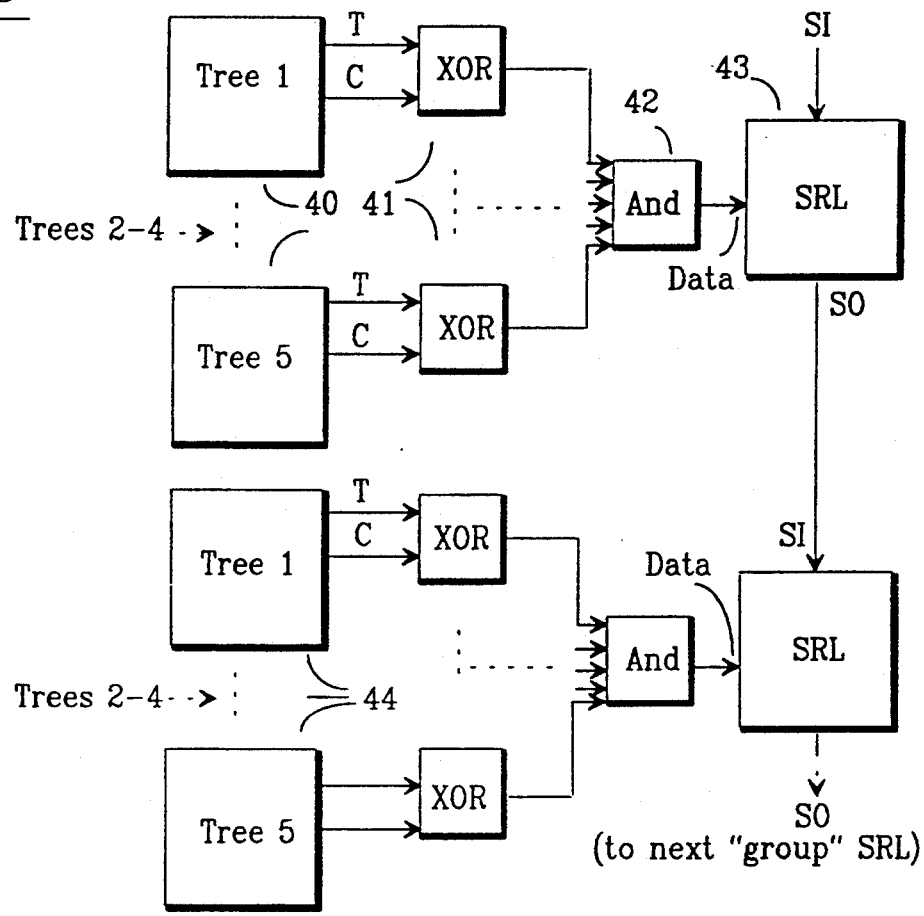
FIG. 3 illustrates a variation of the block configuration of FIG. 2 wherein plural XSCA circuits shown in FIGS. 2 and 2C, each containing an exclusive-OR (XOR) circuit and an SRL circuit, are replaced by plural XOR circuits, a shared AND circuit and a shared SRL circuit.

In FIG. 3, a set of five output boundary trees of a logic group, shown at 40, has outputs coupled to five associated XOR (exclusive-OR) circuits 41, for developing fault indications relative to the associated set of trees. XOR circuits 41 have their outputs coupled through one AND circuit 42 to the fault data input of only one (secondary) SRL circuit 43. By comparison to the XSCA configuration exemplified in FIGS. 2 and 2C, it is seen that SRL 43 and its associated circuits are capable of providing almost the same range of (class 2) fault indication as five of the XSCA circuits of FIG. 2; and can do so with four fewer SRL circuits and one additional AND circuit. It is understood that AND 42 transfers a fault indication to SRL 43 if and only if one or more of the five associated XOR circuits 41 is indicating a (class 2) fault.

A point to note however is that if more than one XOR 41 is indicating a class 2 fault condition, the existence of those conditions (as 2 discrete faults), and locations of circuits responsible therefor, would be more difficult to trace than a comparable set of conditions presented to the XSCA configuration of FIGS. 2 (wherein each fault indication is scanned out through a separate SRL).

In FIG. 3, the logic group containing the trees 40 is shown as containing 10 output boundary trees; the 5 indicated at 40 and another set of 5 indicated generally at 44, the latter set having a separate associated set of XOR's which interacts through one AND circuit and another secondary SRL circuit to provide a separate scan out indication. The intent here is to show that in a logic group with many output boundary trees, the output boundary trees could be grouped into sets of 5 trees (or other numbers of trees) for sharing secondary SRL circuits as shown.

Figure 4:
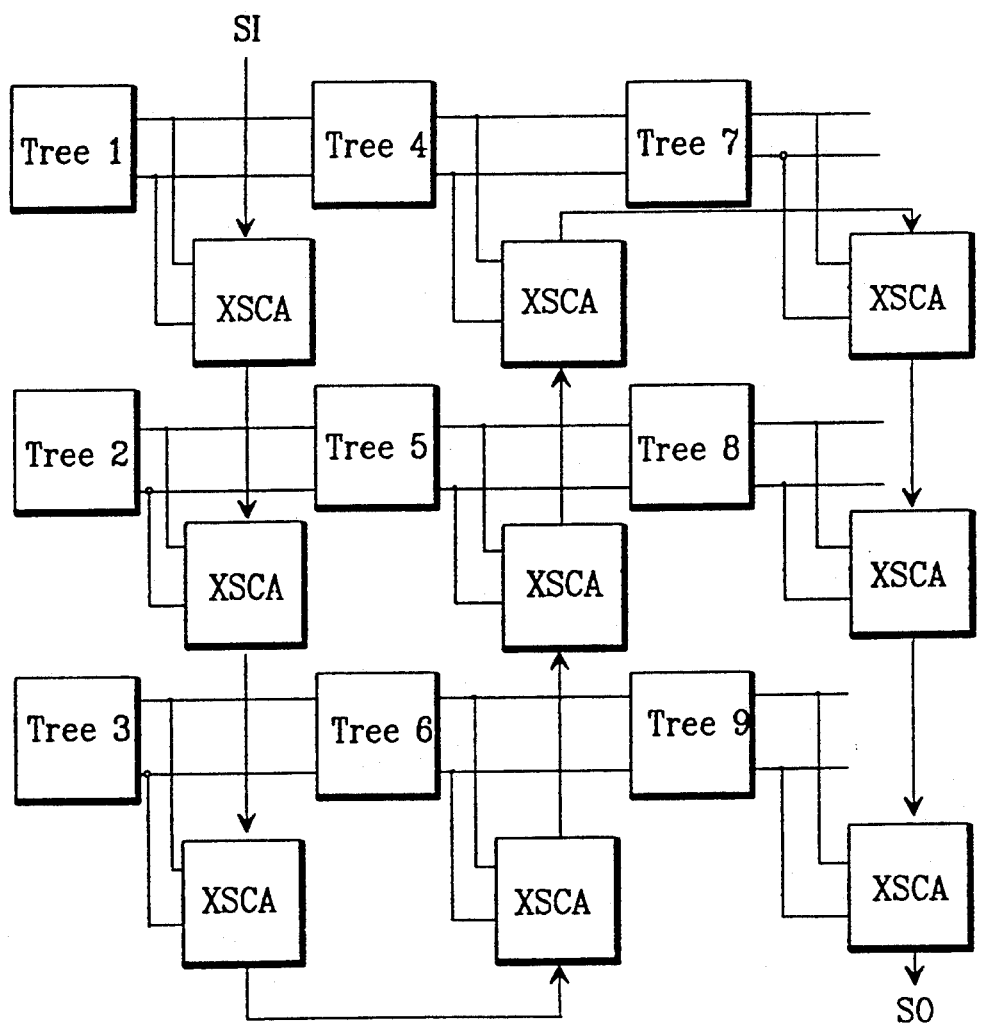
FIG. 4 illustrates another variation of the block configuration of FIG. 2 wherein each DCVS tree feed is paired with an individual XSCA circuit for detection and instant tracing of illegal states in respective trees (by comparison, the XSCA arrangement of FIG. 2 indicates an illegal state within a set of trees requiring further action to trace such state to a single tree).

FIG. 4 illustrates an arrangement distinguished by less sharing of components than either the arrangement of FIG. 2 or that of FIG. 3. In FIG. 4, the output of each tree in a logic group containing 9 trees (trees 1-9) is coupled for fault detection to a respective XSCA circuit of the type shown in FIG. 2C, so that each tree has an associated secondary SRL circuit. With this arrangement, a fault indication scanned out of any XSCA circuit is traceable directly to the corresponding tree (whereas in FIG. 2, a fault in any XSCA is traceable to a sub-group of trees consisting of one output boundary tree and trees coupled to that boundary tree).

Figure 5:
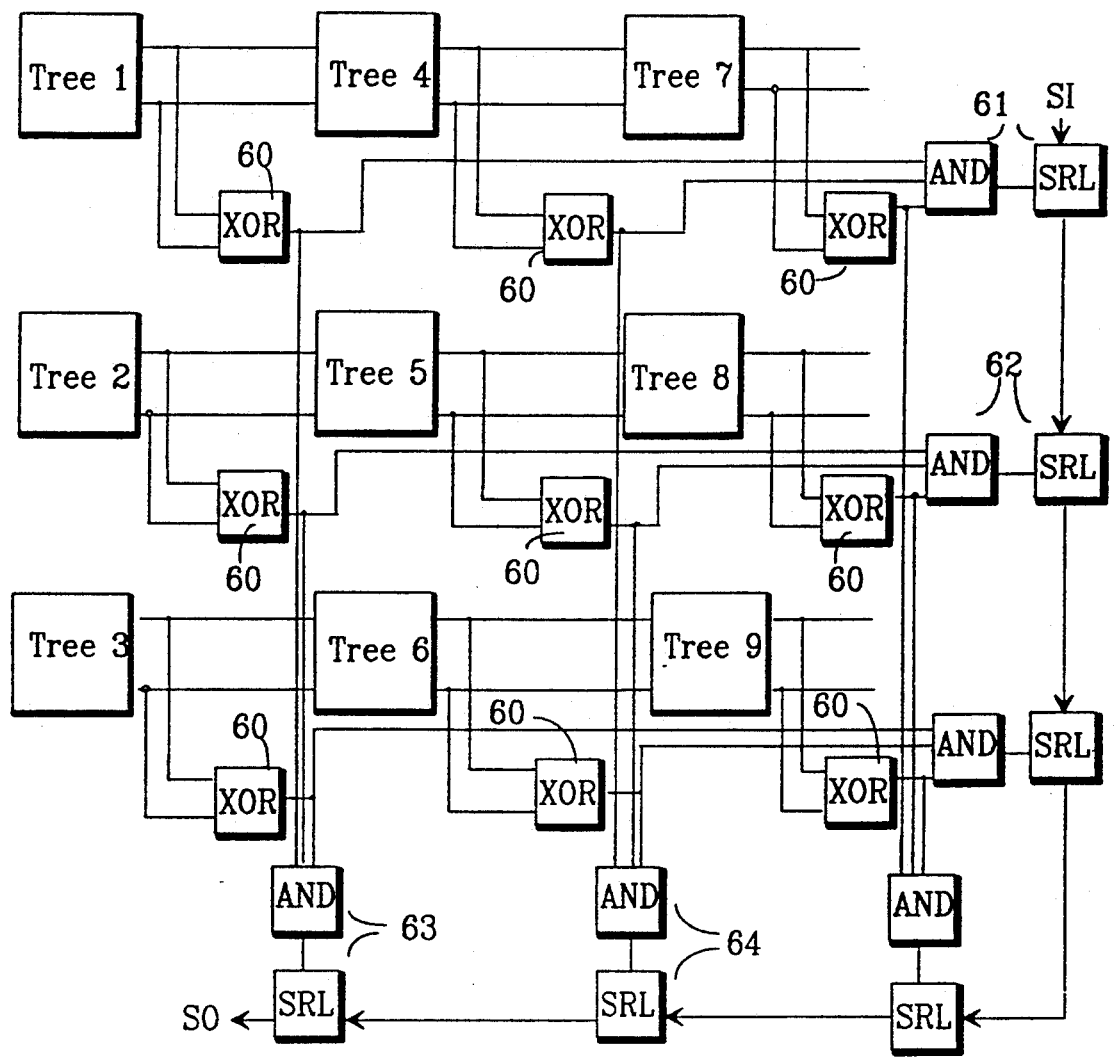
FIG. 5 illustrates a variation of the block configuration of FIG. 4, wherein XSCA circuits of the latter figure are replaced by smaller XOR circuits which interconnect in sets with shared AND circuits and SRL circuits, and wherein the AND and SRL circuits are so arranged that any illegal state in the block is still traceable instantly to its source.

FIG. 5 shows how the fault indicating arrangement of FIG. 4 can be modified to share components with little if any sacrifice of fault location resolution capability. In FIG. 5, the XSCA circuits of FIG. 4 are replaced by XOR circuits 60, and the trees and their XOR's are configured in discrete rows and columns. The XOR's in each row have outputs connected through one "row" AND circuit to one (secondary) "row" SRL circuit. Row AND and SRL circuits associated with the first and second rows are indicated respectively at 61 and 62. The XOR's associated with each column have outputs connected through an associated column AND circuit to an associated column (secondary) SRL circuit. Associated AND and SRL circuits for the first and second columns are indicated respectively at 63 and 64. The row and column SRL's are connected into a single scan array.

Thus, a single class 2 fault in any tree is easily detectable and locatable, since corresponding fault indications will register uniquely in both the associated row SRL and column SRL, and can be easily correlated with the respective tree upon scan out. A point to note here is that if more than one tree in any one row (or column) is in a detectable class 2 fault condition, there will be one fault indication in the associated row (or column) SRL and more than one fault indication in the respective column (or row) SRL's. Thus, locations of multiple class 2 faults may be immediately traceable by this arrangement.

Figure 6:
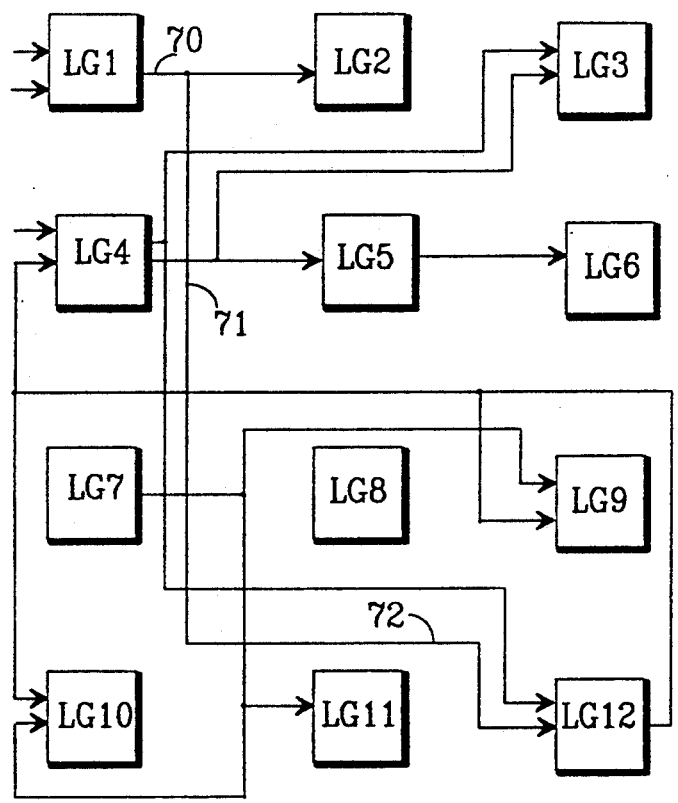
FIG. 6 is a schematic view of a dense configuration of DCVS logic groups, which is useful for explaining topological advantages of having single-track "global" data connections between groups.

FIG. 6 illustrates the topological an circuit packaging advantages of having the present single-track connections between groups (also termed single-track "global" interconnect wiring). This Figure shows 12 logic groups LG1–LG12, intended to represent a densely configured arrangement of circuits with minimal available space between groups. Some of the single-track wiring connections are illustrated, and one in particular is cited at 70–72 for explaining advantages of using single-track global interconnects for transferring data signals between groups.

Group LG1 has a data output connected to group LG12 via linear segment 70–72 of one single track wiring path. Since the space available for accommodating the logic groups, their powering conductors and their global interconnect wiring would be tightly rationed, in an efficiently packaged chip, and since the power and global interconnect wiring may include hundreds of conductors requiring placement in spaces not overshadowed by the group components, it may be appreciated that conductive elements forming a single interconnect path such as 70–72 may have to cross and run adjacent to many other conductors with limited separation spacing between conductors, and the logistical complexity of placing such wiring increases in proportion to the distance between the origin and destination groups. Furthermore, the spacing between such conductors is constrained by considerations of restricting crosstalk/noise between conductors. Now, if global interconnect wiring were the conventional dual-track form, instead of the present single-track form, the number of interconnect wiring segments to be placed within a given segment of chip space would double and the cross-talk constraints upon the segments would become increasingly severe.

We claim:

1. A differential Cascode Voltage Switch (DCVS) circuit comprising:
   first and second groups of DCVS circuit trees; each tree having at least one complementary pair of data signal inputs and at least one complementary pair of data signal outputs; each group containing plural DCVS trees and input interfacing circuit means coupled between said data signal inputs of individual trees int eh respective group and printed circuit conductors connecting data signal sources external to the respective group, said interfacing circuit means applying data signals from said external sources to said tree inputs in complementary paired (dual track) forms;
   said printed circuit conductors including at least one discrete conductor forming a single track conductive connection from an output of a said tree in said first group to the said interfacing circuit means in said second group; each said single track conductive connection serving to transfer data signals between said groups only in single-track (non-complementary) form; and
   said interfacing circuit means in said second group including means for converting signals received through each said single track connection from single track to complementary form and means for applying the converted signals in said complementary form to data signal inputs of specific trees in said second group;
   whereby data signals generated by trees in said first group are carried in single-ended form over individual said single track connections and applied by said interfacing circuit means in said second group, in dual-track complementary form, to inputs of specific tree circuits in said second group.

2. A differential cascode voltage switch (DCVS) circuit comprising:
   plural groups of DCVS circuits, each group containing plural DCVS tree circuits individually adapted for handling data signals only in a dual-track (complementary) form; each said tree circuit having one complementary pair of data signal output and at least one complementary pair of data signal inputs; each said group further comprising input interface circuit means for interfacing between data signal inputs of DCVS tree circuits in the respective group and data signal sources external to the respective group; each said interface circuit means being adapted exclusively for receiving data signals in a single-track (single-ended) form and producing corresponding output data signals in said complementary form;
   each interface circuit means in each group comprising one or more shift register latch (SRL) circuits, each said SRL circuit having a single-ended data signal input and a complementary pair of data signal outputs; and
   a network of discrete printed circuit conductors extending between said groups, said network including data signal conductors for transferring data signals between said groups; said data signal conductors being configured for handling transfers of data signals between groups only in single-track (non-complementary) form; said data signal conductors forming single-track connections, external to said groups, from outputs of DCVS tree circuits in said groups to inputs of SRL circuits in said group input interface circuit means.

3. A DCVS circuit in accordance with claim 2 comprising:
   primary test input means coupled to said SRL circuits in said group input interface circuit means for applying test data signals to said DCVS tree circuits in said groups, through said SRL circuits, by means of which faults in said SRL or DCVS tree circuits in said groups can be detected;
   test output means coupled to said SRL circuits for receiving primary test data output signals from said SRL circuits which represent data signals transferred to said SRL circuits through said printed circuit data conductors; and
   secondary test means including exclusive-OR circuits separate from said SRL circuits, said secondary test means coupled to outputs of said DCVS tree circuits in said groups and serving to provide secondary test data output signals supplementing said primary test data output signals, said secondary test data output signals distinguishing between legal and illegal output states of said DCVS tree circuits in said groups.

4. A differential cascode voltage switch (DCVS) circuit comprising:
   first and second groups of DCVS circuits; each group containing plural DCVS tree circuits; each tree circuit receiving and generating data signals only in complementary (dual-track) form; each group also containing input interface circuit means for receiving data signals only in non-complementary (single-track) form, from sources outside the respective group, and for applying said data signals in complementary dual-track form to DCVS tree circuits in the respective group; said DCVS tree circuits in each said group including one or more input boundary DCVS tree circuits, for receiving said outside source data signals as logical inputs from SRL circuits in the input interface circuit means of the respective group, and one or more output boundary tree circuits for transferring data signals as logical outputs outside the respective group; each tree circuit having only dual-track data signal transfer connections for receiving input data signals, and each tree circuit other than said output boundary tree circuits having only dual-track output connections for transferring data signals to other trees in the same group; and a network of discrete printed circuit data signal conductors extending between said groups; said data signals conductors connecting said group output boundary tree circuits to said group input interface circuit means, for transferring data signals to said input interface circuit means only in single-track form;

each said input interface circuit means including at least one single-track input connection to said data signal conductors, for receiving data signals only in single-track form from said conductors, and at least one primary shift register latch (SRL) circuit, coupled to said single-track input connections; at least one of said primary SRL circuit(s) in said second group receiving data signals in single-track form from an output boundary tree circuit in said first group and transferring said data signals in dual-track form to an input boundary tree circuit in said second group; whereby erroneous data associated with an illegal state of the output boundary tree in said first group is potentially propagatable from said first group to said second group.

5. A DCVS circuit in accordance with claim 4 wherein:

said first and second groups of DCVS circuits are part of an integrated circuit array containing at least one additional DCVS circuit between said first and second groups, and said data signal conductors are required to be routed around said additional DCVS circuit.

6. A DCVS circuit in accordance with claim 4 including:

means coupled to said primary SRL circuits in said first and second groups for supplying test data signals from a source outside of said first and second groups to said input boundary DCVS tree circuits of said groups;

means coupled to said primary SRL circuits in said second group for reading out signals related to said primary test data from said SRL circuits, which related signals have been transferred to respective primary SRL circuits form output boundary tree circuits in said first group via said single-track connections;

means coupled to said output boundary tree of said first group for producing supplemental test data signals distinguishing between legal and illegal signals states produced by said output boundary tree circuits in said first group; and means coupled to said first and second groups for collecting said related test data signals and said supplemental test data signals for evaluation.

7. A fully testable differential cascode voltage switch (DCVS) circuit comprising:

plural groups of DCVS circuits with single-track global interconnect wiring between the groups, said global interconnect wiring including discrete printed circuit conductors serving to transfer data signals between the groups only in single-track form; each said group containing a plurality of DCVS tree circuits and interface circuit means for conveying data signals to said tree circuits, in dual-track form, that are received from said printed circuit conductors in single-track form; said DCVS tree circuits comprising:

at least one input boundary DCVS tree circuit having at least one dual-track input and one dual-track output;

at least one output boundary DCVS tree circuit having at least one dual-track input and one dual-track output;

said interface circuit means of each said group comprising:

primary shift register latch (SRL) circuits forming dual-track data transfer interfaces between said printed circuit conductors and said input boundary tree circuits;

means coupled to each of said primary SRL circuits for transferring primary test data input signals to the respective primary SRL circuit, from a source external to all of said groups, for application via the respective primary SRL circuit to dual-track inputs of input boundary tree circuits in the respective group;

means coupled to each of said primary SRL circuits for reading out data signals from the respective SRL circuit corresponding to data signals transferred to said circuit via a respective one of said single conductors; and secondary fault detection circuit means in each said group, having dual-track connections to outputs of said DCVS tree circuits in the respective group, for detecting existence of illegal state conditions in respective tree circuits.

8. A DCVS circuit in accordance with claim 7 wherein each said secondary fault detection circuit means comprises:

a plurality of XSCA (exclusive-OR scannable circuit array) circuit means, one for each of said output boundary tree circuits, each said XSCA means having a dual-track input connection to the data output of the respective output boundary tree circuit for detecting existence of an illegal data state condition traceable to a set of DCVS tree circuits in the respective group, said set including the respective output boundary tree circuit and all other tree circuits in said group which produce data signals affecting the data output of the respective output boundary tree circuit.

9. A DCVS circuit in accordance with claim 8 wherein each said XSCA circuit means comprises:

an exclusive-OR (XOR) circuit having said two-track connection to the output of said respective output boundary tree circuit; and a secondary SRL (shift register latch) circuit having an input coupled to the output of the respective XOR circuit for temporarily storing output signals generated by said XOR circuit; said stored signals distinguishing between legal and illegal states in the respective said set of tree circuits.

10. A DCVS circuit in accordance with claim 7 wherein said secondary fault detection circuit means for each said group further comprises:

a plurality of XSCA (exclusive-OR scannable circuit array) circuit means, one for each tree circuit in the respective group, each said XSCA means having a dual-track input connection with the data output of the respective tree circuit for detecting existence of an illegal condition in the data output of the respective tree circuit.

11. A DCVS circuit in accordance with claim 10 wherein each said XSCA circuit means comprises:
an exclusive-OR (XOR) circuit having said two-track input connection to the data output of the respective tree circuit; and
a SRL (shift register latch) circuit coupled to the XOR circuit for temporarily storing signals generated at the output of said XOR circuit.

12. A fully testable differential cascode voltage switch (DCVS) circuit comprising:
plural groups of DCVS tree circuits with single-track global interconnect wiring between groups, each group comprising:
at least one input boundary DCVS tree circuit having at least one dual-track input and one dual-track output;
at least one output boundary DCVS tree circuit having at least one dual-track input and one dual-track output;
primary shift register latch (SRL) circuits, associated individually with each of the single-track connections to the respective group from other groups, for coupling signals between the associated single-track connection and one or more dual-track inputs of input boundary trees in the respective group;
means coupled to each of said primary SRL circuits for transferring primary test data input signals to the respective circuit, from a source external to all of said groups, for application via the respective circuit to respective dual-track inputs of input boundary trees in the respective group;
means coupled to each of said primary SRL circuits for reading out signals from said circuit corresponding to signals transferred to said circuit via a respective single-track input connection; and
secondary fault detection circuit means connected to outputs of tree circuits for detecting existence of illegal state conditions in respective tree circuits;
and wherein said secondary fault detection circuit means for each said group further comprises:
one or more sets of plural exclusive-OR (XOR) circuits, each set having dual-track input connections with outputs of a respective set of plural output boundary trees in the respective group;
an AND circuit associated with each set of XOR circuits, each AND circuit having plural inputs, connected to output of all XOR circuits in the respective set of XOR circuits, for causing the AND circuit to generate a secondary fault indication at its output whenever any one or more of the XOR circuits in the respective set produces an output representing existence of an illegal state condition in the output of the respective set of output boundary trees; and
a secondary SRL (shift register latch) circuit associated with each said AND circuit, each secondary SRL circuit having an input coupled to the output of the respective AND circuit, for registering a secondary illegal state fault indication when the respective AND circuit generates a corresponding fault indication at its output.

13. A fully testable differential cascode voltage switch (DCVS) circuit comprising:
plural groups of DCVS tree circuits with single-track global interconnect wiring between groups, each group comprising:
at least one input boundary DCVS tree circuit having at least one dual-track input and one dual-track output;
at least one output boundary DCVS tree circuit having at least one dual-track input and one dual-track output;
primary shift register latch (SRL) circuits, associated individually with each of the single-track input connections to the respective group from other groups, for coupling signals between the associated single-track connection and one or more dual-track inputs of input boundary trees in the respective group;
means coupled to each of said primary SRL circuits for transferring primary test data input signals to the respective circuit, from a source external to all of said groups, for application via the respective circuit to respective dual-track inputs of input boundary trees int eh respective group;
means coupled to each of said primary SRL circuits for reading out signals from said circuit corresponding to signals transferred to said circuit via a respective single-track input connection; and
secondary fault detection circuit means connected to outputs of tree circuits for detecting existence of illegal state conditions in respective tree circuits;
and wherein said secondary fault detection circuit means in each said group further comprises:
a plurality of XSCA (exclusive-OR scannable circuit array) circuit means, one for each tree circuit in the respective group, each said XSCA means having a dual-track input connection with the output of the respective tree circuit for detecting existence of an illegal condition in the output of the respective tree circuit;
and wherein said DCVS tree circuits in each said group are arranged in an orthogonal configuration of rows and columns, and each said fault detection circuit means in each said group further comprises:
a plurality of exclusive-OR (XOR) circuits, one for each of said tree circuits, for detecting illegal state fault conditions in respective tree circuits;
a row AND circuit and associated secondary row SRL (shift register latch) circuit for each row in said orthogonal configuration; each said row AND circuit having input connections to all XOR circuits that are connected to tree circuits in the respective row, and each row SRL circuit having an input connected to the output of the respective row AND circuit for latching output conditions manifested by the respective AND circuit; whereby a row fault indication is latched by any row SRL circuit when any XOR circuit associated with that row generates an illegal state indication at its output; and a column AND circuit and associated column secondary SRL (shift register latch) circuit for each column in said orthogonal configuration; each said column AND circuit having input connections to all XOR circuits that are connected to tree circuits in the respective column, and each column SRL circuit having an input connected to the output of the respective column AND circuit for latching output conditions manifested by the respective AND circuit; whereby a column fault indication is latched by any column SRL circuit when any one of the XOR circuits associated with that column detects a fault condition in a respective tree circuit in that column; whereby row and column fault indications latched in said row and column SRL circuits, when examined conjointly, are indicative of row and column locations of individual tree circuits having illegal state fault conditions.

* * * * *